(12) United States Patent
Tai et al.

(10) Patent No.: US 11,107,973 B2
(45) Date of Patent: Aug. 31, 2021

(54) JOINED BODY OF PIEZOELECTRIC SINGLE-CRYSTAL SUBSTRATE AND SUPPORT SUBSTRATE

(71) Applicant: NGK INSULATORS, LTD., Nagoya (JP)

(72) Inventors: Tomoyoshi Tai, Inazawa (JP); Ryosuke Hattori, Ichinomiya (JP)

(73) Assignee: NGK INSULATORS, LTD., Nagoya (JP)

( * ) Notice: Subject to any disclaimer, the term of this patent is extended or adjusted under 35 U.S.C. 154(b) by 0 days.

(21) Appl. No.: 17/097,563

(22) Filed: Nov. 13, 2020

(65) Prior Publication Data

US 2021/0066577 A1    Mar. 4, 2021

Related U.S. Application Data

(63) Continuation of application No. PCT/JP2019/004999, filed on Feb. 13, 2019.

(30) Foreign Application Priority Data

May 17, 2018   (JP) .............................. JP2018-095260

(51) Int. Cl.
   *H01L 41/08*    (2006.01)
   *H01L 41/312*   (2013.01)
   *H01L 41/187*   (2006.01)

(52) U.S. Cl.
   CPC .......... *H01L 41/312* (2013.01); *H01L 41/081* (2013.01); *H01L 41/1873* (2013.01)

(58) Field of Classification Search
   CPC . H01L 41/081; H01L 41/187; H01L 41/1873; H03H 9/25
   See application file for complete search history.

(56) References Cited

U.S. PATENT DOCUMENTS

| 7,331,092 | B2 | 2/2008 | Miura et al. | |
| 8,907,547 | B2* | 12/2014 | Tai | H01L 41/0838 |
| | | | | 310/358 |
| 10,284,169 | B2 | 5/2019 | Goto et al. | |
| 10,541,667 | B2* | 1/2020 | Gilbert | H03H 9/02574 |
| 2014/0210316 | A1* | 7/2014 | Hori | H01L 41/0838 |
| | | | | 310/348 |

(Continued)

FOREIGN PATENT DOCUMENTS

| JP | 2004343359 A | 12/2004 |
| JP | 201486400 A | 5/2014 |

(Continued)

OTHER PUBLICATIONS

International Search Report with English Translation issued in corresponding International Application No. PCT/JP2019/004999 dated Mar. 26, 2019 (3 pages).

(Continued)

*Primary Examiner* — J. San Martin
(74) *Attorney, Agent, or Firm* — Flynn Thiel, P.C.

(57) ABSTRACT

A bonded body includes a supporting substrate; a piezoelectric single crystal substrate composed of a material selected from the group consisting of lithium niobate, lithium tantalate and lithium niobate-lithium tantalate; and an amorphous layer present between the supporting substrate and piezoelectric material substrate, and the amorphous layer contains one or more metal atoms selected from the group consisting of niobium and tantalum, an atom constituting the supporting substrate, and an argon atom. A concentration of the argon atom in a central part of the amorphous layer is higher than a concentration of the argon atom in a peripheral part of the amorphous layer.

4 Claims, 3 Drawing Sheets

(56) References Cited

U.S. PATENT DOCUMENTS

| | | |
|---|---|---|
| 2014/0210317 A1 | 7/2014 | Tai et al. |
| 2018/0175283 A1 | 6/2018 | Akiyama et al. |
| 2019/0036505 A1 | 1/2019 | Akiyama et al. |
| 2019/0326878 A1* | 10/2019 | Kakita .................. H01L 41/047 |

FOREIGN PATENT DOCUMENTS

| | | | |
|---|---|---|---|
| JP | 2016225537 A | | 12/2016 |
| JP | 2019169850 A | * | 10/2019 |
| WO | 2014077213 A1 | | 5/2014 |
| WO | 2017134980 A1 | | 8/2017 |
| WO | 2017155002 A1 | | 9/2017 |
| WO | 2018180827 A1 | | 10/2018 |

OTHER PUBLICATIONS

Written Opinion of International Searching Authority issued in corresponding International Application No. PCT/JP2019/004999 dated Mar. 26, 2019 (3 pages).

English Translation of the Notice of Reasons for Refusal issued in corresponding Japanese Patent Application No. 2019-544079 (JP 6698954 B) dated Jan. 2020 (3 pages).

English Translation of the Decision to Grant a Patent issued in corresponding Japanese Patent Application No. 2019-544079 (JP 6698954 B) dated Apr. 2020 (2 pages).

English Translation of the International Preliminary Report on Patentability, issued in corresponding International Application No. PCT/JP2019/004999 dated Nov. 26, 2020 (6 pages).

* cited by examiner

JOINED BODY OF PIEZOELECTRIC SINGLE-CRYSTAL SUBSTRATE AND SUPPORT SUBSTRATE

CROSS-REFERENCE TO RELATED APPLICATIONS

This is a continuation of PCT/JP2019/004999, filed Feb. 13, 2019, which claims priority to Japanese Application No. JP2018-095260, filed May 17, 2018, the entire contents of which are hereby incorporated by reference.

TECHNICAL FIELD

The present invention relates to a bonded body of a piezoelectric single crystal substrate and a supporting substrate.

BACKGROUND ARTS

For realizing a high-performance semiconductor device, an SOI substrate composed of a high resistance $Si/SiO_2$ thin film/Si thin film has been widely used. Plasma activation is used for realizing the SOI substrate. This is because the bonding can be realized at a relatively low temperature (400° C.). A composite substrate composed of similar $Si/SiO_2$ thin film/piezoelectric thin film for improving the performance of a piezoelectric device has been proposed (Patent Document 1). According to Patent Document 1, the piezoelectric single crystal substrate composed of lithium niobate or lithium tantalate and silicon substrate with a silicon oxide layer formed thereon are activated by ion activation method followed by the bonding.

Further, the direct bonding method of a so-called FAB (Fast Atom Beam) system is known. According to the method, a neutralized atomic beam is irradiated onto the respective bonding surfaces at an ambient temperature to activate them which are then subjected to direct bonding (Patent Document 2).

According to Patent Document 3, the surface of a silicon substrate and the surface of lithium tantalate substrate are subjected to surface activation by a neutralized atomic beam and are bonded with each other, so that an amorphous layer containing tantalum, silicon, argon and oxygen is generated along an interface between the silicon substrate and lithium tantalate substrate.

RELATED TECHNICAL DOCUMENTS

Patent Document 1: Japanese Patent Publication No. 2016-225537A
Patent Document 2: Japanese Patent Publication No. 2014-086400A
Patent Document 3: WO 2017/134980 A1

SUMMARY OF THE INVENTION

Lithium tantalate or lithium niobate single crystal substrate used for an acoustic wave filter has a low thermal conduction. Due to an increase of transmitted electric power required by a recent increase of communication amount, and heat generation from surrounding devices resulting from fabrication into a module, an acoustic wave filter is susceptible to high temperature under these conditions. As a result, the acoustic wave filter composed of the piezoelectric single crystal substrate could not be used for a high-performance communication device.

Further, according to a method of irradiating a neutralized atomic beam onto the bonding surfaces of a piezoelectric single crystal substrate and a supporting substrate to activate them by a FAB (Fast Atom Beam) system and directly bonding the surfaces with each other, it is possible to dissipate heat toward the side of the supporting substrate so that it is superior in a heat dissipating property than the acoustic wave filter composed of a single plate of a piezoelectric single crystal. However, as a high temperature of about 80° C. is applied onto the bonded body of the piezoelectric single crystal substrate and supporting substrate, warping may occur. A large stress is applied on a crystal face of the piezoelectric single crystal substrate due to a difference of the thermal expansion between the piezoelectric single crystal substrate and supporting substrate.

An object of the present invention is, in a bonded body of a piezoelectric single crystal substrate composed of lithium niobate or the like and supporting substrate, to suppress the warping of the bonded body upon heating.

The present invention provides a bonded body comprising:
a supporting substrate;
a piezoelectric single crystal substrate comprising a material selected from the group consisting of lithium niobate, lithium tantalate and lithium niobate-lithium tantalate; and
an amorphous layer present between the supporting substrate and the piezoelectric single crystal substrate, the amorphous layer comprising one or more metal atoms selected from the group consisting of niobium and tantalum, an atom constituting the supporting substrate, and an argon atom,
wherein a concentration of said argon atom in a central part of the amorphous layer is higher than a concentration of said argon atom in a peripheral part of the amorphous layer.

The inventors have tried to irradiate an argon atomic beam onto bonding surfaces of the piezoelectric single crystal substrate and supporting substrate to activate the respective surfaces and bond the activated surfaces with each other. In this case, a thin amorphous layer is generated along the interface between the piezoelectric single crystal substrate and supporting substrate. However, as the thus obtained bonded body is heated, the warping of the bonded body may occur.

Thus, the inventors have researched the cause of the warping and considered the possibility of the generation of the warping due to a difference of the thermal expansion between the piezoelectric single crystal substrate and supporting substrate. It is structurally difficult to absorb the warping due to the difference of the thermal expansion at a bonding interface between the piezoelectric single crystal substrate and supporting substrate.

When generating the amorphous layer along the bonding interface between the piezoelectric single crystal substrate and supporting substrate, the inventors then tried to change the structure of an emitting aperture of the argon atomic beam to raise the energy intensity of the argon atomic beam at the central part of the bonding interface, so that an argon concentration at the central part is made higher than an argon concentration at the peripheral part of the amorphous layer. The influence of the warping of the bonded body upon heating is then researched. As a result, the considerable reduction of the warping of the bonded body upon heating is confirmed.

Although the reason is not clear, by providing in-plane distribution of the concentrations in which the argon concentration in the central part of the amorphous layer is higher, the in-plane distribution of the thickness of the amorphous layer can be adjusted so that the thickness is the largest at the central part. As a result, the stress applied onto the piezoelectric single crystal upon heating can be relaxed to suppress the warping of the bonded body upon heating.

EMBODIMENTS FOR CARRYING OUT THE INVENTION

Figure 1A:
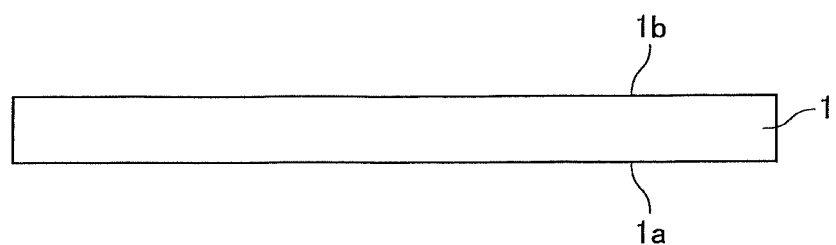
FIG. 1(a) shows a piezoelectric single crystal substrate 1.

The present invention will be described further in detail, appropriately referring to the drawings.

Figure 1B:
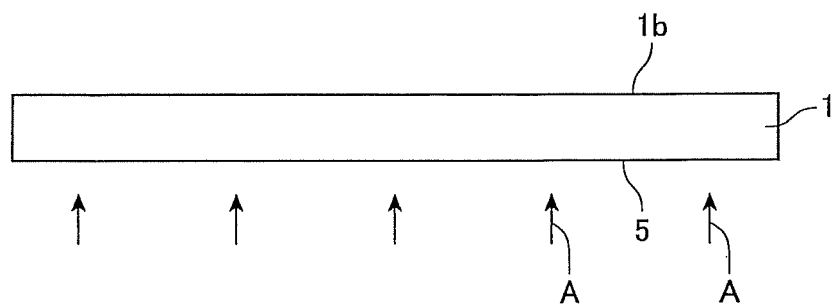
FIG. 1(b) shows the state that argon atomic beam A is irradiated onto a surface 1a of the piezoelectric single crystal substrate 1 to generate an activated surface 5.

First, as shown in FIG. 1(a), a piezoelectric single crystal substrate 1 having a pair of main surfaces 1a and 1b is prepared. Then, as shown in FIG. 1(b), an argon atomic beam is irradiated onto a bonding surface 1a of the piezoelectric single crystal substrate 1 shown as arrows A to obtain a surface-activated bonding surface 5.

Figure 2A:
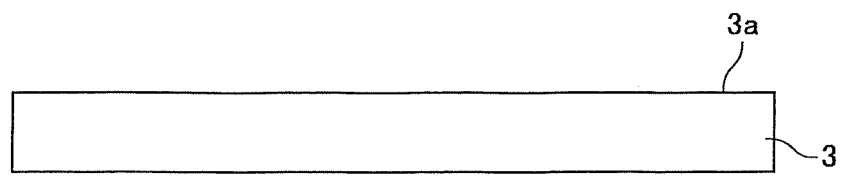
FIG. 2(a) shows a supporting substrate 3.
Figure 2B:
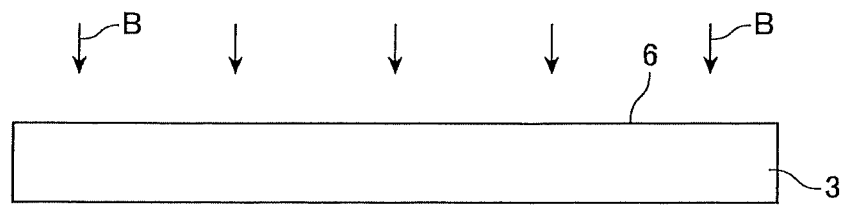
FIG. 2(b) shows the state that argon atomic beam B is irradiated onto a surface 3a of the supporting substrate 3.

Further, as shown in FIG. 2(a), a supporting substrate 3 having a surface 3a is prepared. Then, as shown in FIG. 2(b), an argon atomic beam is irradiated onto a surface 3a of the supporting substrate shown as arrows B to perform the surface activation to form an activated bonding surface 6.

Figure 3A:
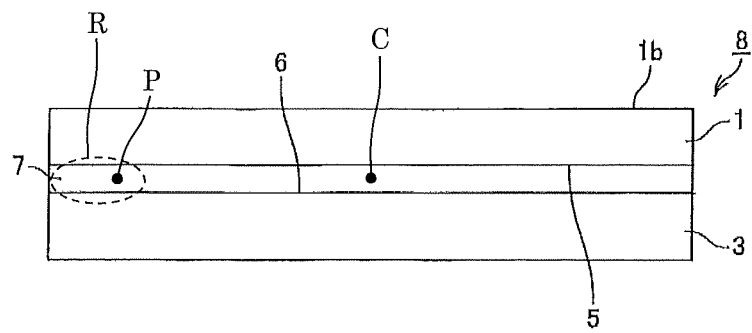
FIG. 3(a) shows a bonded body 8 of the piezoelectric single crystal substrate 1 and supporting substrate 3.

Then, the activated bonding surface 5 of the piezoelectric single crystal substrate 1 and the activated bonding surface 6 of the supporting substrate 3 are contacted and directly bonded with each other to obtain a bonded body 8 shown in FIG. 3(a). Here, an amorphous layer 7 is generated between the bonding surface 6 of the supporting substrate 3 and the bonding surface 5 of the piezoelectric single crystal substrate 1.

Figure 3B:
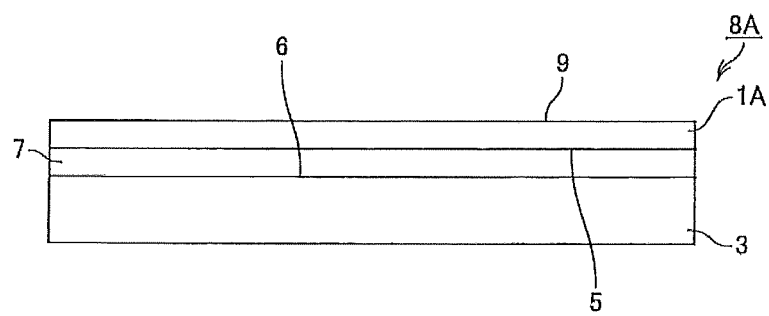
FIG. 3(b) shows the state that a piezoelectric single crystal substrate 1 of a bonded body 8A is thinned by processing.
Figure 3C:
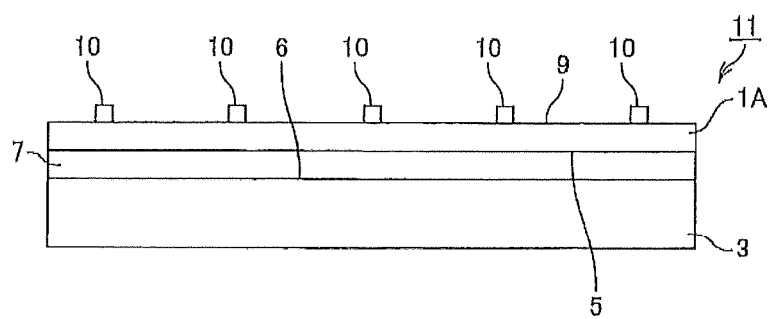
FIG. 3(c) shows an acoustic wave device 11.

In this state, electrodes may be provided on the piezoelectric single crystal substrate 1. However, preferably, a main surface 1b of the piezoelectric single crystal substrate 1 is processed as shown in FIG. 3(b) to thin the substrate 1 to obtain a thinned piezoelectric single crystal substrate 1A. 9 represents a processed surface. Then, as shown in FIG. 3(c), predetermined electrodes 10 are formed on the processed surface 9 of the piezoelectric single crystal substrate 1A of the bonded body 8A to obtain an acoustic wave device 11.

(Amorphous Layer)

According to the present invention, an amorphous layer 7 is provided between the supporting substrate 3 and the piezoelectric single crystal substrate 1 or 1A. The amorphous layer 7 contains one or more metal atoms selected from the group consisting of niobium and tantalum, an atom constituting the supporting substrate 3, and an argon atom.

One or more metal atoms selected from the group consisting of niobium and tantalum may be niobium alone, tantalum alone, or both niobium and tantalum. In the case that both niobium and tantalum are contained in the amorphous layer 7, the concentration of the metal atoms are a sum of the concentrations of niobium and tantalum.

Further, in the case that the atoms constituting the supporting substrate 3 is of a single kind, the atoms constituting the amorphous layer 7 is also of a single kind. In the case that plural kinds of atoms constitute the supporting substrate 3, the atoms constituting the supporting substrate 3 is one or more of these atoms. It is further provided that niobium, tantalum and oxygen are excluded from the atoms constituting the supporting substrate 3.

According to the present invention, the concentration of argon atoms in the central part of the amorphous layer 7 is made higher than the concentration of argon atoms in a peripheral part of the amorphous layer. Here, in the specification as shown in FIG. 3(a), the central part C of the amorphous layer 7 means a center of the amorphous layer 7 in the case that the amorphous layer 7 is viewed in a plan view. Further, the concentration in the peripheral part P of the amorphous layer 7 is obtained by measuring the concentrations at three positions in a ring-shaped region R extending from the end part (edge) of the amorphous layer 7 in the direction toward the center in a width of 5 to 10 mm and by obtaining the average value.

From the viewpoint of bonding strength, the concentration of argon atoms in the central part of the amorphous layer 7 may preferably be 2.0 atomic % or higher and more preferably be 2.4 atomic % or higher. Further, usually, the concentration of argon atoms in the central part of the amorphous layer 7 is preferably 5.0 atomic % or lower and more preferably 4.8 atomic % or lower.

From the viewpoint of the bonding strength, the concentration of argon atoms in the peripheral part of the amorphous layer 7 may preferably be 2.0 atomic % or higher and more preferably 2.7 atomic % or higher. Further, usually, the concentration of argon atoms in the peripheral part of the amorphous layer is preferably 5.0 atomic % or lower and more preferably 4.7 atomic % or lower.

From the viewpoint of reducing the warping of the bonded body 8 or 8A upon heating, a difference between the concentrations of argon atoms in the central part and in the peripheral part of the amorphous layer 7 may preferably be 1.0 atomic % or larger and more preferably 1.5 atomic % or larger.

According to a preferred embodiment, the concentration of the metal atoms in the amorphous layer 7 is 40 to 50 atomic % and more preferably be 41.8 to 46.7 atomic %.

In the amorphous layer 7, the atom constituting the supporting substrate 3 are atoms other than tantalum, niobium, and oxygen atoms. The atom is preferably silicon. The concentration of the atom constituting the supporting substrate 3 in the amorphous layer 7 is preferably 25 to 40 atomic % and more preferably 28.3 to 38.1 atomic %.

According to a preferred embodiment, the amorphous layer 7 contains oxygen atom. In this case, the concentration of the oxygen atom is preferably 15 to 21 atomic % and more preferably 17.1 to 20.2 atomic %.

According to a preferred embodiment, the thickness of the central part of the amorphous layer 7 is larger than the thickness of the peripheral part of the amorphous layer 7. It is thereby possible to further reduce the warping of the bonded body upon heating. From this viewpoint, a difference between the thickness of the central part of the amorphous layer 7 and the thickness of the peripheral part of the amorphous layer 7 is preferably 1.0 nm or larger and more preferably 1.5 nm or larger.

Further, the thickness of the central part of the amorphous layer 7 is preferably 5 to 8 nm and more preferably 5.9 to 6.8 nm. Further, the thickness of the peripheral part of the amorphous layer 7 is preferably 4 to 5 nm and more preferably 4.4 to 4.9 nm.

Further, the presence of the amorphous layer 7 is to be confirmed as follows.

Measuring System:

The microstructure is observed using a transmission-type electron microscope ("H-9500" supplied by Hitachi High-Tech Corporation).

Measuring Conditions:

A sample after thinning is observed by a FIB (Focused Ion Beam) method at an accelerating voltage of 200 kV.

The concentrations of the respective atoms in the amorphous layer 7 is to be measured as follows.

Measuring System:

The elementary analysis is performed using an elementary analyzing system ("JEM-ARM200F" supplied by JEOL Ltd.).

Measurement Conditions:

A sample after thinning is observed by a FIB (Focused Ion Beam) method at an accelerating voltage of 200 kV.

Although the material of the supporting substrate 3 is not particularly limited, a semiconductor with high thermal conduction such as Si, SiC, GaN, or a ceramic such as AlN or SiC, or the like may be used.

The piezoelectric material substrate 1 (1A) used in the present invention is made of lithium tantalate (LT), lithium niobate (LN), or a lithium niobate-lithium tantalate Solid solution. These materials have high propagation speeds of a surface acoustic wave and large electro-mechanical coupling factors, so they are preferred for use in a surface acoustic wave device for high frequency and wide-band frequency applications.

Further, the normal direction of the main surface of the piezoelectric single crystal substrate 1 (1A) is not particularly limited. For example, when the piezoelectric single crystal substrate 1 (1A) is made of LT, it is preferred to use the substrate rotated from Y-axis toward Z-axis by 32 to 55° (180°, 58° to 35°, 180° on Eulerian angle representation) around X-axis, which is a direction of propagation of a surface acoustic wave, because of a low propagation loss. When the piezoelectric single crystal substrate 1 (1A) is made of LN, (i) it is preferred to use the substrate rotated from Z-axis toward Y-axis by 37.8° (0°, 37.8°, 0° on Eulerian angle representation) around X-axis, which is a direction of propagation of a surface acoustic wave, because of a large electro-mechanical coupling factor. Alternatively, (ii) it is preferred to use the substrate rotated from Y-axis toward Z-axis by 40 to 65° (180°, 50 to 25°, 180° on Eulerian angle representation) around X-axis, which is a direction of propagation of a surface acoustic wave, because a high acoustic speed can be obtained. Further, although the size of the piezoelectric single crystal substrate 1 (1A) is not particularly limited, for example, the diameter may be 100 to 200 mm and thickness may be 0.15 to 1 mm.

From the viewpoint of the performance of an acoustic wave device 11, the thickness of the piezoelectric single crystal substrate 1A may preferably be 20 µm or smaller. Further, from the viewpoint of convenience of handling of the bonded body 8(8A), the thickness of the supporting substrate 3 may preferably be 150 µm or larger and more preferably be 230 µm or larger. On the other hand, if the supporting substrate 3 is thicker, the thermal resistance of the bonded body 8(8A) as a whole is raised. Therefore, the thickness may preferably be 750 µm or smaller and more preferably be 675 µm or smaller.

Preferably, argon atomic beams A and B are irradiated onto the surface 1a of the piezoelectric single crystal substrate 1 and the surface 3a of the supporting substrate 3, respectively, to activate the respective surfaces 1a and 3a.

When the surface activation by the argon atomic beam is performed, it is preferred to use a system described in JP 2014-086400A to generate the argon atomic beam, which is irradiated. That is, it is used a high-speed atomic beam source of a saddle field type as the beam source. Then, an inert gas is introduced into a chamber and a high voltage is applied onto electrodes from a direct current electric source. As a result, an electric field of a saddle field type generated between the electrode (positive electrode) and a housing (negative electrode) causes motion of the electrons, e, so that atomic and ion beams are generated. Among the beams that reach a grid, the ion beam is neutralized at the grid, and the beam of argon atoms is emitted from the high-speed atomic beam source. In the activation step by beam irradiation, the voltage may preferably be 0.5 to 2.0 kV and the current may preferably be 50 to 200 mA.

When a high-speed atomic beam is irradiated onto the piezoelectric single crystal substrate 1 and supporting substrate 3, a grid is used in which a distribution in the sizes, directions, and inclination of the holes is provided so that a larger amount of the beam is irradiated onto the central part. Specifically, the central part of the substrate to be irradiated by the beam is positioned on an extended line connecting the center of the incident side and the center of the emitting side of the grid hole in a central region of the grid. The size of the grid hole in the central region of the grid is 30 mm by 30 mm, or may be made larger than the size of the grid hole in the other region of the grid by 15 to 30%. Alternatively, the flow rate of Ar gas may be increased by 40 percent only in the central region of the grid having a size of 30 mm by 30 mm so that distribution can be provided in the amount of the irradiated beam. However, the present invention is not limited to the methods described above, and as a result, any method may be used provided that the beam is irradiated onto the central part more than onto the peripheral part.

Then, the activated surfaces 5 and 6 are contacted and bonded with each other under a vacuum atmosphere. The temperature at this time may be an ambient temperature, specifically and preferably 40° C. or lower and more preferably 30° C. or lower. Further, the temperature during the bonding may more preferably be 20° C. or higher and 25° C. or lower. The pressure at the time of bonding is preferably 100 to 20000N.

According to a preferred embodiment, the surface 1a of the piezoelectric single crystal substrate 1 and surface 3a of the supporting substrate 3 are subjected to a flattening process before being irradiated with the argon atomic beam. The method of flattening the respective surface 1a and 3a includes lapping, chemical mechanical polishing (CMP), and the like. Further, the flattened surface may preferably have Ra of 1 nm or lower and more preferably have Ra of 0.3 nm or lower.

Thereafter, an annealing treatment may preferably be performed to improve the bonding strength. The temperature during the annealing treatment may preferably be 100° C. or higher and 300° C. or lower.

The bonded bodies 8 and 8A of the present invention may preferably be used as an acoustic wave device 11.

As the acoustic wave device 11, a surface acoustic wave device, Lamb wave-type device, thin film resonator (FBAR), or the like is known. For example, the surface acoustic wave device is produced by providing an input side IDT (Interdigital Transducer) electrodes (also referred to as comb electrodes or interdigitated electrodes) for oscillating surface acoustic wave and an IDT electrode on the output side for receiving the surface acoustic wave on the surface of the piezoelectric single crystal substrate. By applying a high frequency signal on the IDT electrode on the input side, an electric field is generated between the electrodes, so that the surface acoustic wave is oscillated and propagated on the piezoelectric single crystal substrate. Then, the propagated surface acoustic wave is taken out as an electrical signal from the IDT electrodes on the output side provided in the direction of the propagation.

A material forming the electrode 10 of the piezoelectric single crystal substrate 1A may preferably be aluminum, an aluminum alloy, copper, or gold, and more preferably be aluminum or the aluminum alloy. The aluminum alloy may preferably be Al with 0.3 to 5 weight % of Cu mixed therein. In this case, Ti, Mg, Ni, Mo, or Ta may be used instead of Cu.

EXAMPLES

Inventive Example 1

The bonded body 8A shown in FIG. 3(b) was produced according to the method described with reference to FIGS. 1 to 3.

Specifically, a 42Y-cut black LiTaO$_3$ (LT) substrate (piezoelectric single crystal substrate) 1 having a thickness of 0.25 mm and mirror polished on both sides was prepared, and a Si substrate (supporting substrate) 3 having a thickness of 0.23 mm and a high resistance (≥2kΩ·cm). The sizes of the substrates were 100 mm, respectively. The surface 1a of the piezoelectric single crystal substrate 1 and the surface 3a of the supporting substrate 3 were then cleaned, respectively, to remove particles from the surfaces.

The surface 1a of the piezoelectric single crystal substrate 1 and the surface 3a of the supporting substrate 3 were then subjected to surface activation. Specifically, both substrates were introduced into a super-high vacuum chamber and the respective surfaces were subjected to surface activation by an argon atomic beam for 50 seconds. At this time, a grid was used whose grid hole sizes were made larger by 20 percent only in a region having a size of 30 mm by 30 mm in the central part so that a larger amount of the argon atomic beam is irradiated onto the central part of each of the surfaces 1a and 3a.

The bonding surfaces 5 and 6 of the respective substrates were brought into contact with each other at room temperature. They were brought into contact with the piezoelectric single crystal substrate 1 positioned upward and a load of 200 kgf was applied thereon. The bonded body 8 was then taken out of the chamber, placed into an oven filled with nitrogen and then held at 120° C. for 10 hours to obtain the bonded body 8 to improve the bonding strength.

The thus obtained bonded body 8 was then subjected to grinding and polishing of the piezoelectric single crystal substrate 1 to finally obtain the bonded body 8A with the piezoelectric single crystal substrate 1A having a thickness of 20 μm.

Here, the concentrations of the respective atoms in the amorphous layer 7 at the bonding interface of the piezoelectric single crystal substrate 1A and the supporting substrate 3, and thickness of the amorphous layer 7, were measured as described above. The results of the measurement are shown in Table 1 and below. Further, the thus obtained bonded body was heated at 80° C., and the value of SORI was measured.

Here, SORI was measured by using a laser displacement meter "LK-G5000" supplied by KEYENCE, height information of a wafer mounted on a movable stage was measured, and scan measurement was performed on lines. The measurement was performed on two lines of horizontal and vertical directions passing through an orientation flat of the wafer, and a larger value of SORI was selected as SORI of the wafer.

Tantalum: 46.7 atomic % (Central part), 42.1 atomic % (Peripheral part)
Silicon: 28.3 atomic % (Central part), 38.0 atomic % (Peripheral part)
Oxygen: 20.2 atomic % (Central part), 17.2 atomic % (Peripheral part)
Argon: 4.8 atomic % (Central part), 2.7 atomic % (Peripheral part)

TABLE 1

| | | Inventive example 1 | | Inventive example 2 | | Comparative example 1 | | Comparative example 2 | |
| --- | --- | --- | --- | --- | --- | --- | --- | --- | --- |
| Piezoelectric single crystal substrate | | Lithium tantalate | | Lithium tantalate | | Lithium tantalate | | Lithium tantalate | |
| Supporting substrate | | Si | | Si | | Si | | Si | |
| FAB irradiation amount (kJ) | | 180 | | 180 | | 180 | | 360 | |
| Concentration of atom at | | Central part | Peripheral part | Central part | Peripheral part | Central part | Peripheral part | Central part | Peripheral part |
| bonding | Ta or Nb | 46.7 | 42.1 | 45.7 | 41.8 | 41.5 | 42.2 | 46.0 | 46.7 |
| interface | O | 20.2 | 17.2 | 17.1 | 17.4 | 17.7 | 17.6 | 17.4 | 18.2 |
| (atom %) | Si | 28.3 | 38.0 | 33.0 | 38.1 | 38.4 | 37.6 | 31.9 | 30.4 |
| | Ar | 4.8 | 2.7 | 4.2 | 2.7 | 2.4 | 2.6 | 4.7 | 4.7 |
| Thickness of amorphous layer (nm) | | 5.9 | 4.4 | 6.8 | 4.9 | 4.5 | 4.2 | 5.8 | 5.5 |
| SORI upon heating at 80° C. (um) | | 320 | | 300 | | 650 | | 600 | |

Inventive Example 2

The bonded body 8A was produced and evaluated according to the same procedure as that of the Inventive Example 1. However, in the present example, the materials of the piezoelectric single crystal substrates 1 and 1A were lithium niobate (LN) single crystals. The results were shown in Table 1 and below.

Niobium: 45.7 atomic % (Central part), 41.8 atomic % (Peripheral part)
Silicon: 33.0 atomic % (Central part), 38.1 atomic % (Peripheral part)
Oxygen: 17.1 atomic % (Central part), 17.4 atomic % (Peripheral part)

Argon: 4.2 atomic % (Central part), 2.7 atomic % (Peripheral part)

Comparative Example 1

The bonded body 8A was produced and evaluated according to the same procedure as that of the Inventive Example 1. However, in the present example, the sizes of the grid holes at the emitting aperture of the argon atomic beam were made equal in the central and peripheral parts, so that the argon atomic beam was irradiated onto the whole of the bonding surface 8A substantially uniformly. The results were shown in Table 1 and below.
Tantalum: 41.5 atomic % (Central part), 42.2 atomic % (Peripheral part)
Silicon: 38.4 atomic % (Peripheral part), 37.6 atomic % (Peripheral part)
Oxygen: 17.7 atomic % (Central part), 17.6 atomic % (Peripheral part)
Argon: 2.4 atomic % (Central part), 2.6 atomic % (Peripheral part)

Comparative Example 2

The bonded body 8A was produced and evaluated according to the same procedure as that of the Comparative Example 1. However, in the present example, the irradiation amount of the argon atomic beam was raised to 360 kJ. The results were shown in Table 1 and below.
Tantalum: 46.0 atomic % (Central part), 46.7 atomic % (Peripheral part)
Silicon: 31.9 atomic % (Central part), 30.4 atomic % (Peripheral part)
Oxygen: 17.4 atomic % (Central part), 18.2 atomic % (Peripheral part)
Argon: 4.7 atomic % (Central part), 4.7 atomic % (Peripheral part)

As shown in Table 1, in Comparative Example 1, the concentration of the argon atoms in the central part of the amorphous layer 7 is 2.4 atomic %, the concentration of the argon atoms in the peripheral part of the amorphous layer 7 was 2.6 atomic %, the thickness of the amorphous layer 7 in the central part was 4.5 nm, the thickness of the amorphous layer 7 in the peripheral part was 4.2 nm, and the SORI upon heating at 80° C. was proved to be 650 μm.

In Comparative Example 2, the concentration of the argon atoms in the central part of the amorphous layer 7 was 4.7 atomic %, the concentration of argon atoms in the peripheral part of the amorphous layer 7 was 4.7 atomic %, the thickness of the amorphous layer 7 in the central part was 5.8 nm, the thickness of the amorphous layer in the peripheral part was 5.5 nm, and the SORI upon heating at 80° C. was proved to be 600 nm, which is not much improved compared to that of the Comparative Example 1.

In Inventive Example 1, the concentration of the argon atoms in the central part of the amorphous layer 7 was 4.8 atomic %, the concentration of the argon atoms in the peripheral part of the amorphous layer 7 was 2.7 atomic %, the thickness of the amorphous layer 7 in the central part was 5.9 nm, the thickness of the amorphous layer 7 in the peripheral part was 4.4 nm, and the SORT upon heating at 80° C. was reduced to 320 μm.

In Inventive Example 2, the concentration of the argon atoms in the central part of the amorphous layer 7 was 4.2 atomic %, the concentration of the argon atoms in the peripheral part of the amorphous layer 7 was 2.7 atomic %, the thickness of the amorphous layer 7 in the central part was 6.8 nm, the thickness of the amorphous layer 7 in the peripheral part was 4.9 nm, and the SORI upon heating at 80° C. was reduced to 300 μm.

The invention claimed is:

1. A bonded body comprising:
   a supporting substrate;
   a piezoelectric single crystal substrate comprising a material selected from the group consisting of lithium niobate, lithium tantalate and lithium niobate-lithium tantalate; and
   an amorphous layer present between said supporting substrate and said piezoelectric single crystal substrate, said amorphous layer comprising one or more metal atoms selected from the group consisting of niobium and tantalum, an atom constituting said supporting substrate, and an argon atom,
   wherein a concentration of said argon atom in a central part of said amorphous layer viewed in a plan view to a thickness direction of said piezoelectric single crystal substrate is higher than a concentration of said argon atom in a peripheral part of said amorphous layer viewed in the plan view to the thickness direction of said piezoelectric single crystal substrate.

2. The bonded body of claim 1, wherein a thickness of said central part of said amorphous layer is larger than a thickness of said peripheral part of said amorphous layer.

3. The bonded body of claim 1, wherein said supporting substrate comprises silicon.

4. The bonded body of claim 1, wherein said piezoelectric single crystal substrate has a thickness of 50 μm or smaller.

* * * * *